United States Patent
Stuckey et al.

(10) Patent No.: US 11,221,368 B2
(45) Date of Patent: Jan. 11, 2022

(54) SYSTEMS AND METHODS FOR DETERMINING BATTERY CAPACITY IN PORTABLE ELECTRONIC DEVICES

(71) Applicant: VeriFone, Inc., San Jose, CA (US)

(72) Inventors: Robert Stuckey, San Jose, CA (US); Nageswari Srinivasan, Dublin (IE)

(73) Assignee: VERIFONE, INC., Wilmington, DE (US)

( * ) Notice: Subject to any disclaimer, the term of this patent is extended or adjusted under 35 U.S.C. 154(b) by 136 days.

(21) Appl. No.: 16/679,077

(22) Filed: Nov. 8, 2019

(65) Prior Publication Data

US 2021/0141025 A1   May 13, 2021

(51) Int. Cl.
*G01R 31/3835* (2019.01)
*G01R 31/36* (2020.01)
*G01R 31/389* (2019.01)

(52) U.S. Cl.
CPC ..... *G01R 31/3835* (2019.01); *G01R 31/3648* (2013.01); *G01R 31/389* (2019.01)

(58) Field of Classification Search
None
See application file for complete search history.

(56) References Cited

U.S. PATENT DOCUMENTS

| | | |
|---|---|---|
| 2006/0001429 A1 | 1/2006 | Huang |
| 2009/0027056 A1 | 1/2009 | Huang et al. |
| 2011/0160665 A1 * | 6/2011 | Rufer ............... G01R 31/382 604/131 |
| 2012/0143585 A1 | 6/2012 | Barsukov et al. |
| 2016/0356855 A1 * | 12/2016 | Egai .................. H01M 10/44 |
| 2017/0356962 A1 * | 12/2017 | Takahashi ........... G01R 31/367 |
| 2018/0254640 A1 | 9/2018 | Jung et al. |
| 2018/0335478 A1 * | 11/2018 | Kondo ................ G01R 31/367 |

OTHER PUBLICATIONS

International Search Report, dated Jan. 21, 2021, from corresponding International Application No. PCT/US2020/056044.
Written Opinion of the International Searching Authority, dated Jan. 21, 2021, from corresponding International Application No. PCT/US2020/056044.

* cited by examiner

*Primary Examiner* — Jas A Sanghera
(74) *Attorney, Agent, or Firm* — Bond, Schoeneck & King, PLLC

(57) ABSTRACT

Systems and methods for determining battery capacity in portable electronic devices are disclosed. In one embodiment, a method for determining battery capacity in a portable electronic device may include: (1) disabling battery charging for the portable electronic device; (2) measuring a voltage and a current across terminals for a battery installed in the portable electronic device; (3) calculating a voltage offset across the battery using an estimate of an internal resistance for the battery by multiplying the current by the estimate of the internal resistance for the battery; (4) calculating an estimate of the open circuit voltage for the battery by subtracting the voltage offset across the battery calculated from the measured voltage; (5) retrieving a battery capacity based on the estimate of the open circuit voltage; (6) quantifying the battery capacity; and (7) displaying the quantified battery capacity.

20 Claims, 3 Drawing Sheets

SYSTEMS AND METHODS FOR DETERMINING BATTERY CAPACITY IN PORTABLE ELECTRONIC DEVICES

BACKGROUND OF THE INVENTION

1. Field of the Invention

The present disclosure relates generally to systems and methods for determining battery capacity in portable electronic devices.

2. Description of the Related Art

Portable electronic devices often use a "fuel gauge" or similar device that monitors a battery's voltage, current, and temperature to estimate the battery's available capacity. To do this, an initial open circuit voltage that represents absolute capacity is measured, and then the coulombs or charge gained or lost are counted, thereby increasing or decreasing the capacity. The initial capacity estimation requires a no-load environment, which requires the device to be connected to an external power source. When a battery is "hot swapped" (i.e., replaced without plugging the device into an external power source), the fuel gauge loses its memory and cannot accurately estimate available battery capacity of the new battery. Instead, the device must be plugged into an external power source in order to recalibrate the fuel gauge and accurately estimate the available battery capacity. Because of this, the electronic device may prematurely shut itself down even though there may be adequate battery capacity available to continue normal operation.

SUMMARY OF THE INVENTION

Systems and methods for determining battery capacity in portable electronic devices are disclosed. In one embodiment, a method for determining battery capacity in a portable electronic device may include: (1) disabling battery charging for the portable electronic device; (2) measuring a voltage and a current across terminals for a battery installed in the portable electronic device; (3) calculating a voltage offset across the battery using an estimate of an internal resistance for the battery by multiplying the current by the estimate of the internal resistance for the battery; (4) calculating an estimate of the open circuit voltage for the battery by subtracting the voltage offset across the battery calculated from the measured voltage; (5) retrieving a battery capacity based on the estimate of the open circuit voltage; (6) quantifying the battery capacity; and (7) displaying the quantified battery capacity.

In one embodiment, the method may further include retrieving the estimate of the internal resistance of the battery from a memory of the portable electronic device.

In one embodiment, the battery capacity may be retrieved from a table in memory that includes a correlation between battery capacities and open circuit voltages.

In one embodiment, the battery capacity may be retrieved in milliamp hours or as a percentage of a known total battery capacity for the battery.

In one embodiment, the battery capacity may be quantified as a percentage of known total battery capacity for the battery remaining, as an estimate of the number of transactions that the portable electronic device may perform, or as an estimate of portable electronic device run time remaining.

In one embodiment, the quantified battery capacity may be displayed as a graphical representation of the quantified battery capacity.

In one embodiment, the method may further include removing the battery from the portable electronic device.

According to another embodiment, a method for determining battery capacity in a portable electronic device may include: (1) disabling battery charging for the portable electronic device; (2) measuring a first voltage and a first current at a battery installed in the portable electronic device under a first load; (3) measuring a second voltage and a second current at the battery under a second load, wherein the second load is different from the first load; (4) calculating an internal resistance for the battery based on the first voltage, the second voltage, the first current, and the second current, wherein the internal resistance for the battery is calculated by dividing the difference of the first voltage and the second voltage by the difference between the first current and the second current; (5) measuring a third voltage at the battery terminals; (6) calculating a voltage offset across the battery due to the internal battery resistance by multiplying the third voltage by the internal battery resistance; (7) calculating an estimate of the open circuit voltage for the battery by subtracting the voltage offset across the battery from the third voltage; (8) retrieving a battery capacity based on the estimate of the open circuit voltage; (9) quantifying the battery capacity; and (10) displaying the quantified battery capacity.

In one embodiment, the first load or the second load may be a minimal load on the battery.

In one embodiment, the battery capacity may be retrieved from a table in memory comprising a correlation between battery capacities and open circuit voltages.

In one embodiment, the battery capacity may be retrieved in milliamp hours or as a percentage of a known total battery capacity for the battery.

In one embodiment, the battery capacity may be quantified as a percentage of known total battery capacity for the battery remaining, as an estimate of the number of transactions that the portable electronic device may perform, or as an estimate of portable electronic device run time remaining.

In one embodiment, the quantified battery capacity may be displayed as a graphical representation of the quantified battery capacity.

In one embodiment, the method may further include removing the battery from the portable electronic device.

According to another embodiment, a portable electronic device may include: a fuel gauge; a replaceable battery; a controller; a memory comprising a look up table; a load; and a display. The controller may disable battery charging for the portable electronic device. The fuel gauge may measure a voltage and a current across terminals for a battery. The controller may receive the voltage and current and may calculate a voltage offset across the battery using an estimate of an internal resistance for the battery by multiplying the current by the estimate of the internal resistance for the battery. The controller may calculate an estimate of the open circuit voltage for the battery by subtracting the voltage offset across the battery calculated from the measured voltage. The controller may retrieve a battery capacity from the look-up table based on estimate of the open circuit voltage. The controller may controller quantify the battery capacity, and may cause the display to display the quantified battery capacity on the display.

In one embodiment, the memory may store the estimate for the internal resistance of the battery.

In one embodiment, the memory may store a table comprising a correlation between battery capacities and open circuit voltages.

In one embodiment, battery capacity may be retrieved in milliamp hours or as a percentage of a known total battery capacity for the battery.

In one embodiment, the battery capacity may be quantified as a percentage of known total battery capacity for the battery remaining, as an estimate of the number of transactions that the portable electronic device may perform, or as an estimate of portable electronic device run time remaining.

In one embodiment, the display displays the quantified battery capacity as a graphical representation of the quantified battery capacity.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF PREFERRED EMBODIMENTS

Embodiments are directed to systems and methods for determining battery capacity.

Figure 1:
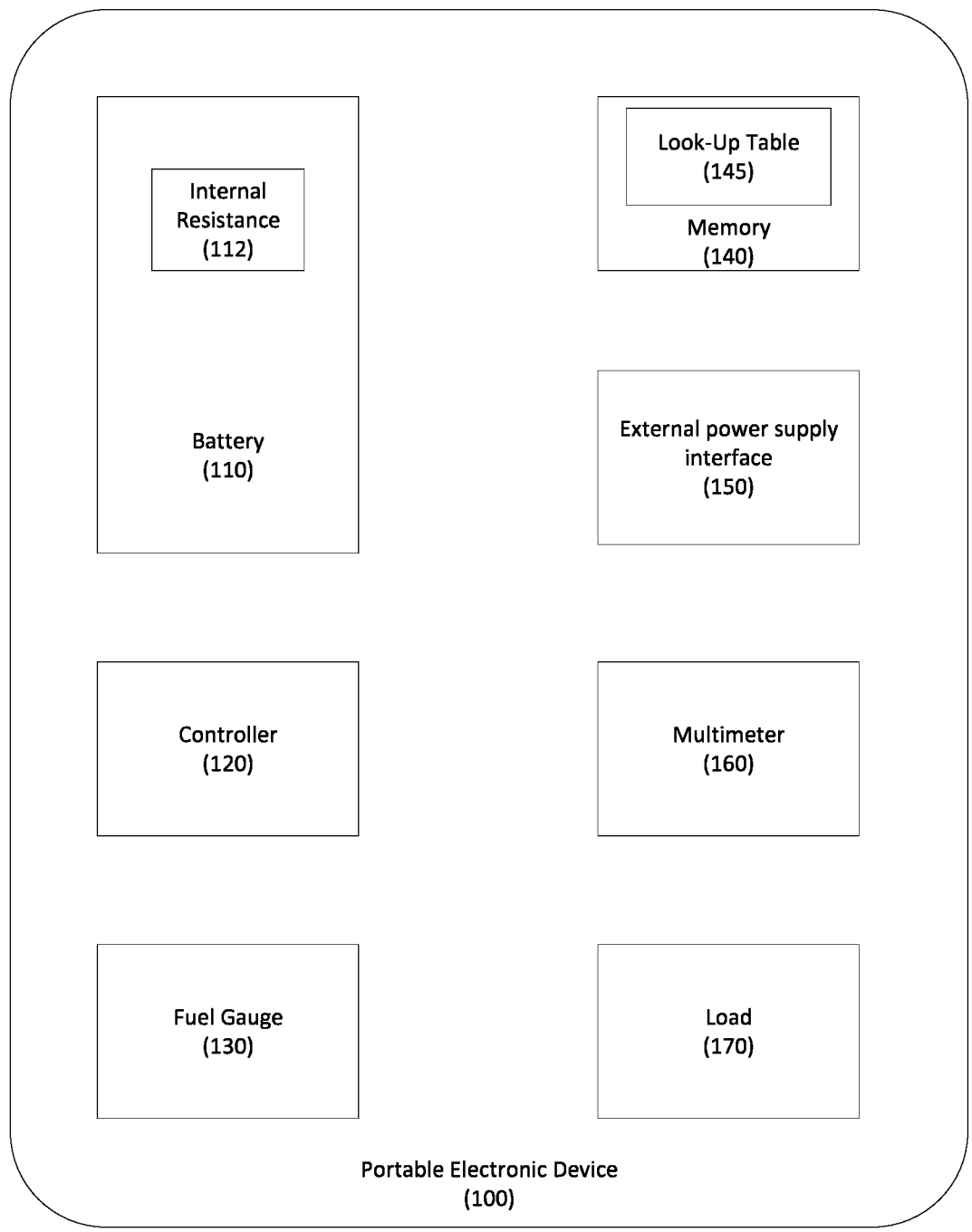
FIG. 1 depicts a system for determining battery capacity according to one embodiment.

Referring to FIG. 1, electronic device 100 is provided. Electronic device 100 may be a portable electronic device that may be powered by an external power source or battery 110. Electronic device 100 may be any suitable electronic device that may have a removable battery and may require reliable information on the battery capacity and available hours to discharge. Examples of such portable electronic devices include mobile point of sale devices.

Electronic device 100 may include battery 110, controller 120, fuel gauge 130, memory 140 which may store look-up table 145, external power supply interface 150 for interfacing with an external power supply, multimeter 160 (which may be part of fuel gauge 130), and load 170.

In one embodiment, controller 120 and/or fuel gauge 130 may measure the voltage, current, and temperature of battery 110, and may process the values with an internal analog-to-digital converter (ADC). The voltage and/or current may be measured by multimeter 160, which, as discussed above, may be provided as part of fuel gauge 130, as a separate element in portable electronic device 110, etc.

Controller 120 may acquire the values from fuel gauge 130 and/or multimeter 160 and may process the data.

Fuel gauge 130 may be a self-contained controller, capable of determining battery capacity, counting coulombs, and providing the battery capacity to controller 120. Fuel gauge 130 may be powered by battery 110, so that when battery 110 is removed, fuel gauge 130 may lose power and may reset its memory.

In embodiments, fuel gauge 130 may not be present in portable electronic device 100, or may not be working; thus, using an analog-to-digital converter (ADC) (not shown), controller 120 may acquire the values from the ADC and/or multimeter 160 and process the data.

Look-up table 145 may identify a relationship between open-circuit voltage (OCV) versus battery capacity. Thus, for any OCV, a corresponding available battery capacity may be retrieved.

In one embodiment, memory 140 may store a value for internal resistance 112 of battery 110. In one embodiment, it may store values for a plurality of battery types if more than one battery may be used by portable electronic device 100.

For example, each battery type may have its own look-up table 145. In one embodiment, look-up table 145 may be part of the firmware for the device that may be held in flash memory, may baked into read-only memory, etc.

Battery 110 may be any suitable battery for device 100. Battery 110 has internal resistance 112, and any current flow through the battery results in a voltage drop across the internal resistance. An illustrative range for the internal resistance is between 100 to 400 milliohms. The internal resistance may vary by battery type, battery state (e.g., temperature, percent charged, etc.), and battery age.

Device 100 may further include external power source interface 150 that may interface with a source of AC or DC current. In one embodiment, the external power source may be under the domain of a battery charger integrated circuit (not shown) that takes power from the from the external power source, provides power to the elements of portable electronic device 110, and routes power to and from the battery depending on the load.

Load 170 may be an internal element in portable electronic device 100 that draws current, such as a radio interface (e.g., a WiFi transceiver), a backlight, a thermal printer, etc. In one embodiment, load 170 may be a load that is external to portable electronic device 100.

Figure 2:
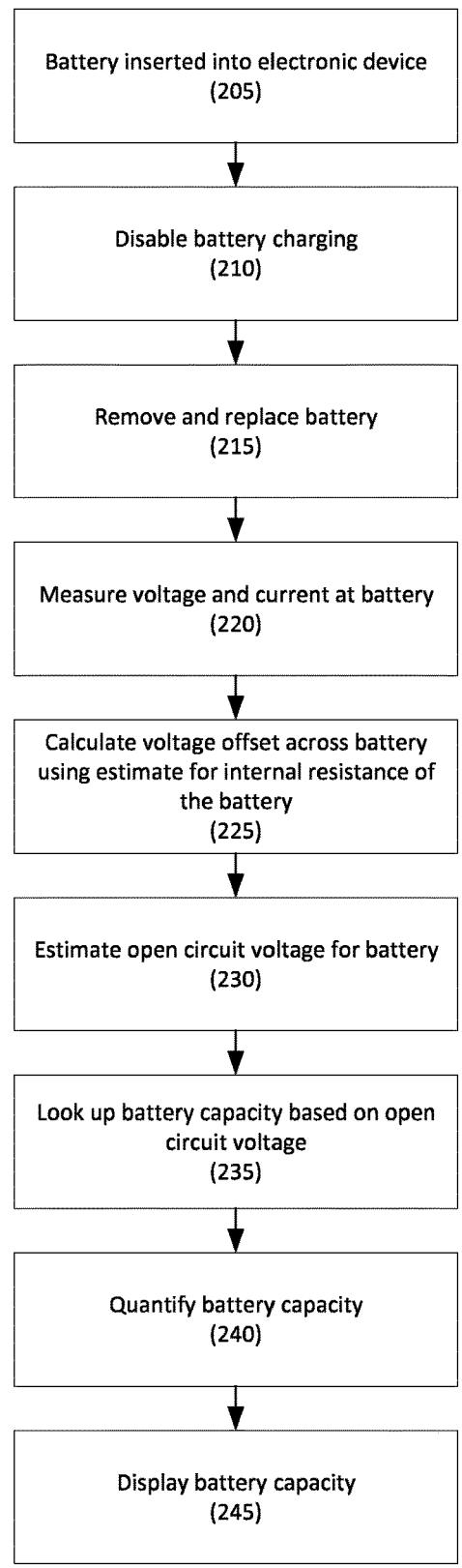
FIG. 2 depicts a method for determining battery capacity according to one embodiment.

Referring to FIG. 2, a method for determining battery capacity is provided according to one embodiment.

In step 205, a battery may be connected to the electronic device.

In step 210, battery charging may be disabled. For example, if the device is connected to an external power source, the device may be disconnected from the external power source. Thus, the electronic device is powered solely by the battery.

In step 215, the battery may be removed and replaced. In one embodiment, the battery may be removed and replaced with a different battery, with the same battery, etc.

In step 220, a controller and/or a fuel gauge may measure a voltage across the positive and negative terminals of the battery and a current drawn from the battery. For example, a multimeter in the electronic device, in the fuel gauge, etc. may perform the measurements.

In step 225, using an estimated value for the internal resistance of the battery, the voltage offset across the battery due to the internal battery resistance may be calculated by multiplying the current measured in step 220 by the estimated value for the internal resistance for the battery. The estimated value may be based on the battery type, battery capacity, battery chemistry, etc.

In step 230, an estimate of the open circuit voltage for the battery may be calculated. In one embodiment, this may be calculated by subtracting the voltage offset across the battery calculated in step 225 from the battery voltage measured in step 220.

In step 235, the battery capacity may be identified by using the open circuit voltage to look up the battery capacity in a lookup table for the type of battery. In one embodiment, the battery capacity may be returned in milliamp hours, as a percentage of the total known battery capacity for the battery, etc.

In step 240, the battery capacity may be quantified. For example, the battery capacity may be quantified as a percentage of total battery capacity remaining, as an estimate of the number of transactions that the electronic device may perform, as an estimate of device run time remaining, etc.

In step 245, a representation of the battery capacity may be displayed as a percentage to full charge, a graphical representation of the battery with varying degrees of fullness, an estimate of remaining device run time based on general usage estimates or current usage or average usage over a period of time, an estimated number of transactions remaining, a color, etc. Any suitable manner of conveying available battery capacity may be used as is necessary and/or desired.

In one embodiment, steps 220-245 may be repeated. The steps may be repeated until the device is turned off, the battery is replaced, the device is connected to an external power source, etc.

Figure 3:
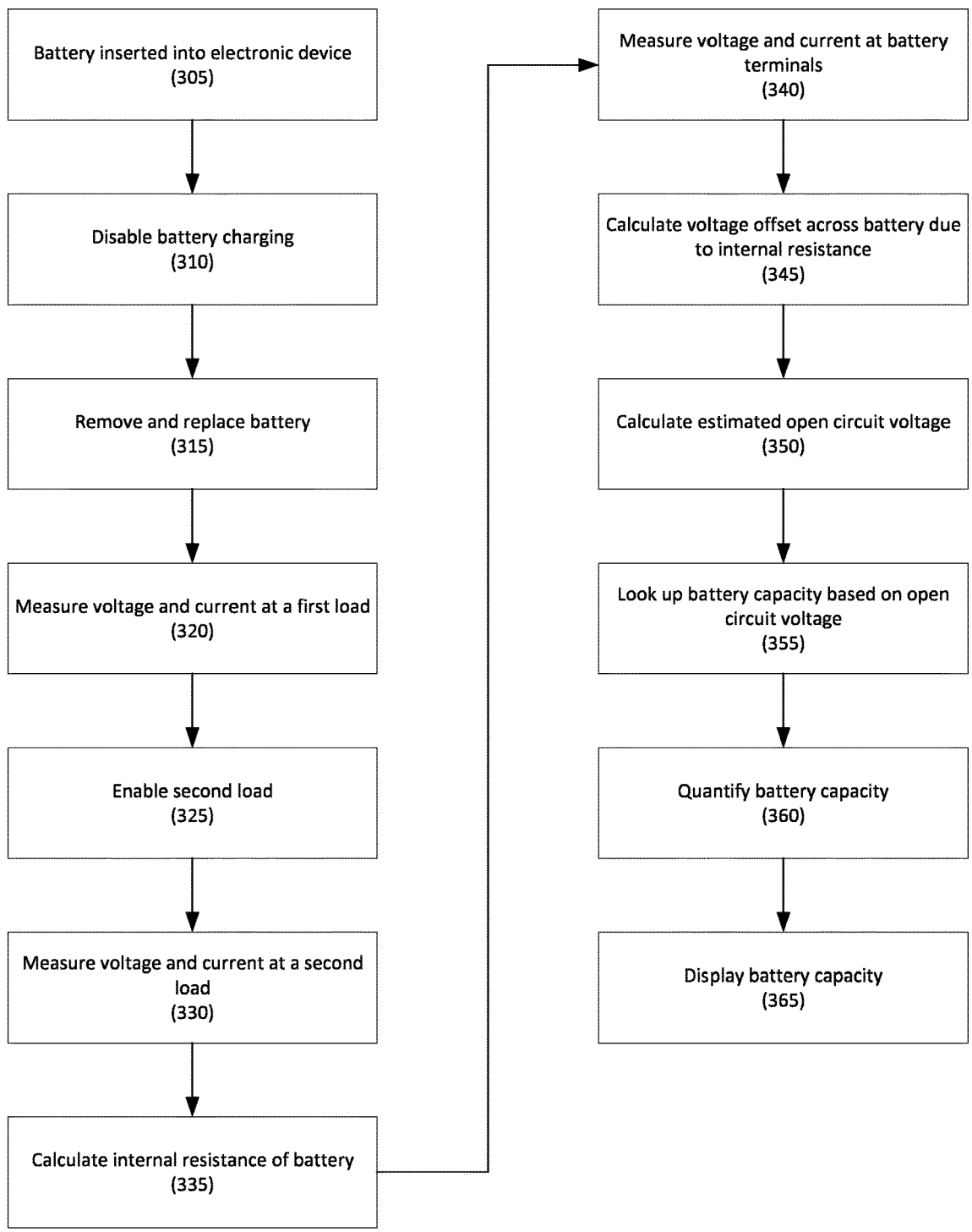
FIG. 3 depicts a method for determining battery capacity according to another embodiment.

Referring to FIG. 3, a method for determining battery capacity is disclosed according to another embodiment.

In step 305, a battery may be connected to the electronic device. This may be similar to step 205, above.

In step 310, battery charging may be disabled. This may be similar to step 210, above.

In step 315, the battery may be removed and replaced. This may be similar to step 215, above.

In step 320, a controller and/or a fuel gauge may measure a first voltage across the positive and negative terminals of the battery and a first current drawn from the battery when connected to a first load. In one embodiment, the first load may be a minimal load on the battery, such as when most or all components of the electronic device (e.g., backlight for the screen, WiFi transceiver, etc.) are disabled.

In another embodiment, the first load may have multiple devices on the electronic device turned on.

In step 325, a second load on the battery that is different from the first load may be enabled. The second load may be enabled by, for example, turning on the screen, WiFi, etc.

In one embodiment, if the first load had multiple devices on the electronic device turned on, the second load may turn off those electronic devices.

In step 330, a second voltage and the second current at the battery may be measured.

In one embodiment, the load may be specified in advance, and the current used may be known. For example, when booted and under no load, a device may be known to consume 200 mA, and when a first feature is turned on, the device may consume 400 mA.

In step 335, the internal resistance of the battery may be calculated by dividing the difference between the first and second voltages by the difference between the currents. The internal resistance of the battery may be saved in memory of the device, the fuel gauge, etc. for use in determining capacity.

In one embodiment, the internal resistance of the current battery may be measured whenever a new battery is inserted into the electronic device.

In step 340, during device operation, the voltage and current at the battery may be measured. In one embodiment, this may be done periodically (e.g., every 10 seconds), on demand, or as otherwise necessary and/or desired. If periodic measurements are performed, they may be set to any desired interval.

In step 345, the voltage offset across the battery due to the internal battery resistance may be calculated by multiplying the current measured in step 235 by the internal resistance for the battery.

In step 350, an estimate of the open circuit voltage for the battery may be calculated. In one embodiment, this may be calculated by subtracting the voltage offset across the battery calculated in step 345 from the battery voltage measured in step 340.

In step 355, the battery capacity may be identified by using the open circuit voltage to look up the battery capacity in a lookup table for the type of battery. In one embodiment, battery capacity may be returned in milliamp hours, as a percentage of total battery capacity, etc.

In one embodiment, multiple battery types may be available for the device, and the appropriate table may be selected by the fuel gauge based on battery self-identification, user identification, etc. In one embodiment, a resistor identifier may be used to identify the battery type, For example, a resistance of 300 ohms+/−30 may indicate battery type one, 3000 ohms+/−80 would indicate battery type five, etc.

In step 360, the battery capacity may be quantified. For example, the battery capacity may be quantified in percentage of battery life left, in an estimate of the number of transactions that the electronic device may perform, in an estimate of battery time remaining, a etc.

In step 365, a representation of the battery capacity may be displayed as a percentage to full charge, a graphical representation of the battery with varying degrees of fullness, an estimate of remaining device run time based on general usage estimates or current usage or average usage over a period of time, an estimated number of transactions remaining, a color, etc. Any suitable manner of conveying available battery capacity may be used as is necessary and/or desired.

In one embodiment, steps 340-365 may be repeated. The steps may be repeated until the device is turned off, the battery is replaced, the device is connected to an external power source, etc.

It will be appreciated by persons skilled in the art that the present invention is not limited by what has been particularly shown and described hereinabove. Rather the scope of the present invention includes both combinations and subcombinations of features described hereinabove and variations and modifications thereof which are not in the prior art. It should further be recognized that these embodiments are not exclusive to each other.

It will be readily understood by those persons skilled in the art that the embodiments disclosed here are susceptible to broad utility and application. Many embodiments and adaptations of the present invention other than those herein described, as well as many variations, modifications and equivalent arrangements, will be apparent from or reasonably suggested by the present invention and foregoing description thereof, without departing from the substance or scope of the invention.

Accordingly, while the present invention has been described here in detail in relation to its exemplary embodiments, it is to be understood that this disclosure is only illustrative and exemplary of the present invention and is made to provide an enabling disclosure of the invention. Accordingly, the foregoing disclosure is not intended to be construed or to limit the present invention or otherwise to exclude any other such embodiments, adaptations, variations, modifications or equivalent arrangements.

What is claimed is:

1. A method for determining battery capacity in a portable electronic device, comprising:

disabling battery charging for the portable electronic device;

connecting a replaceable battery to the portable electronic device, wherein the replaceable battery is configured to power a fuel gauge;

measuring, via the fuel gauge, a voltage and a current across terminals for the replaceable battery installed in the portable electronic device;

calculating a voltage offset across the replaceable battery using an estimate of an internal resistance for the battery by multiplying the current by the estimate of the internal resistance for the battery;

calculating an estimate of the open circuit voltage for the battery by subtracting the voltage offset across the replaceable battery calculated from the measured voltage;

retrieving a battery capacity based on the estimate of the open circuit voltage;

quantifying the battery capacity; and displaying the quantified battery capacity.

2. The method of claim 1, further comprising:
retrieving the estimate of the internal resistance of the replaceable battery from a memory of the portable electronic device.

3. The method of claim 1, wherein the battery capacity is retrieved from a table in memory comprising a correlation between battery capacities and open circuit voltages.

4. The method of claim 1, wherein the battery capacity is retrieved in milliamp hours or as a percentage of a known total battery capacity for the replaceable battery.

5. The method of claim 1, wherein the battery capacity is quantified as a percentage of known total battery capacity for the battery remaining, as an estimate of the number of transactions that the portable electronic device may perform, or as an estimate of portable electronic device run time remaining.

6. The method of claim 1, wherein the quantified battery capacity is displayed as a graphical representation of the quantified battery capacity.

7. The method of claim 1, further comprising:
removing the replaceable battery from the portable electronic device.

8. A method for determining battery capacity in a portable electronic device, comprising:
disabling battery charging for the portable electronic device;
connecting a replaceable battery to the portable electronic device, wherein the replaceable battery is configured to power a fuel gauge;
measuring, via the fuel gauge, a first voltage and a first current at the replaceable battery installed in the portable electronic device under a first load;
measuring, via the fuel gauge, a second voltage and a second current at the replaceable battery under a second load, wherein the second load is different from the first load;
calculating an internal resistance for the replaceable battery based on the first voltage, the second voltage, the first current, and the second current, wherein the internal resistance for the replaceable battery is calculated by dividing the difference of the first voltage and the second voltage by the difference between the first current and the second current;
measuring, via the fuel gauge, a third voltage and a third current at the battery terminals;
calculating a voltage offset across the replaceable battery due to the internal battery resistance by multiplying the third current by the internal battery resistance;

calculating an estimate of the open circuit voltage for the replaceable battery by subtracting the voltage offset across the battery from the third voltage;

retrieving a battery capacity based on the estimate of the open circuit voltage;

quantifying the battery capacity; and displaying the quantified battery capacity.

9. The method of claim 8, wherein the first load or the second load comprises a minimal load on the replaceable battery.

10. The method of claim 8, wherein the battery capacity is retrieved from a table in memory comprising a correlation between battery capacities and open circuit voltages.

11. The method of claim 8, wherein the battery capacity is retrieved in milliamp hours or as a percentage of a known total battery capacity for the replaceable battery.

12. The method of claim 8, wherein the battery capacity is quantified as a percentage of known total battery capacity for the battery remaining, as an estimate of the number of transactions that the portable electronic device may perform, or as an estimate of portable electronic device run time remaining.

13. The method of claim 8, wherein the quantified battery capacity is displayed as a graphical representation of the quantified battery capacity.

14. The method of claim 8, further comprising:
removing the replaceable battery from the portable electronic device.

15. A portable electronic device comprising:
a fuel gauge;
a replaceable battery configured to power the fuel gauge;
a controller;
a memory comprising a look up table;
a load; and
a display;
wherein:
wherein the controller disables battery charging for the portable electronic device;
the fuel gauge measures a voltage and a current across terminals for a battery;
the controller receives the voltage and current and calculates a voltage offset across the replaceable battery using an estimate of an internal resistance for the replaceable battery by multiplying the current by the estimate of the internal resistance for the replaceable battery;
the controller calculates an estimate of the open circuit voltage for the replaceable battery by subtracting the voltage offset across the replaceable battery calculated from the measured voltage;
the controller retrieves a battery capacity based on estimate of the open circuit voltage;
the controller quantifying the battery capacity; and
the controller causing the display to display the quantified battery capacity on the display.

16. The portable electronic device of claim 15, wherein the memory stores the estimate for the internal resistance of the replaceable battery.

17. The portable electronic device of claim 15, wherein the memory stores a table comprising a correlation between battery capacities and open circuit voltages.

18. The portable electronic device of claim 15, wherein the battery capacity is retrieved in milliamp hours or as a percentage of a known total battery capacity for the replaceable battery.

19. The portable electronic device of claim 15, wherein the battery capacity is quantified as a percentage of known total battery capacity for the battery remaining, as an estimate of the number of transactions that the portable electronic device may perform, or as an estimate of portable electronic device run time remaining.

20. The portable electronic device of claim 15, wherein the display displays the quantified battery capacity as a graphical representation of the quantified battery capacity.

* * * * *